United States Patent
Lin et al.

(10) Patent No.: US 10,622,080 B1
(45) Date of Patent: Apr. 14, 2020

(54) NON-VOLATILE MEMORY AND READING METHOD THEREOF

(71) Applicant: MACRONIX International Co., Ltd., Hsinchu (TW)

(72) Inventors: Yu-Yu Lin, New Taipei (TW); Feng-Min Lee, Hsinchu (TW); Ming-Hsiu Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 16/285,048

(22) Filed: Feb. 25, 2019

Related U.S. Application Data (60) Provisional application No. 62/773,198, filed on Nov. 30, 2018.

(51) Int. Cl.
| | | |
|---|---|---|
| *G11C 16/16* | (2006.01) | |
| *G11C 16/34* | (2006.01) | |
| *G11C 16/12* | (2006.01) | |
| *G11C 16/26* | (2006.01) | |

(52) U.S. Cl.
CPC ......... *G11C 16/3459* (2013.01); *G11C 16/12* (2013.01); *G11C 16/16* (2013.01); *G11C 16/26* (2013.01)

(58) Field of Classification Search
CPC ...... G11C 16/16; G11C 16/14; G11C 16/3445
USPC ........................................ 365/185.29, 185.18
See application file for complete search history.

(56) References Cited

U.S. PATENT DOCUMENTS

| | | | |
|---|---|---|---|
| 2008/0310232 A1 | 12/2008 | Surico et al. | |
| 2011/0194357 A1* | 8/2011 | Han | G11C 16/16 365/185.29 |
| 2017/0256320 A1 | 9/2017 | Lang et al. | |

OTHER PUBLICATIONS

Yu-Yu Lin, et al., "A Novel Voltage-Accumulation Vector-Matrix Multiplication Architecture Using Resistor-shunted Floating Gate Flash Memory Device for Low-power and High-density Neural Network Applications," 2018 IEEE International Electron Devices Meeting, Dec. 2018, pp. 24.1-24.4.
"Office Action of Taiwan Counterpart Application," dated Aug. 26, 2019, p. 1-p. 8.

\* cited by examiner

*Primary Examiner* — Jason Lappas
(74) *Attorney, Agent, or Firm* — J.C. Patents (57) ABSTRACT

A non-volatile memory and its reading method are provided. The reading method includes: erasing a plurality of memory cells in a memory cell string; setting a target memory cell of the memory cells, setting an initial voltage, generating a plurality of programming voltages by gradually increasing the initial voltage based on a step value, sequentially performing a plurality of programming operations by the target memory cell according to the programming voltages, and verifying the target memory cell to obtain a first verifying current during the programming operations; setting a corresponding programming voltage as a target voltage through determining the first verifying current and a first reference current; and performing the programming operations on the memory cells other than the target memory cell according to the target voltage and setting the memory cell string as a reading reference memory cell string.

16 Claims, 7 Drawing Sheets

NON-VOLATILE MEMORY AND READING METHOD THEREOF

CROSS-REFERENCE TO RELATED APPLICATION

This application claims the priority benefit of U.S. provisional application Ser. No. 62/773,198, filed on Nov. 30, 2018. The entirety of the above-mentioned patent application is hereby incorporated by reference herein and made a part of this specification.

TECHNICAL FIELD

The disclosure relates to a non-volatile memory and a reading method thereof; more particularly, the disclosure relates to a non-volatile memory capable of improving stability of reading data and a reading method thereof.

DESCRIPTION OF RELATED ART

Figure 1:
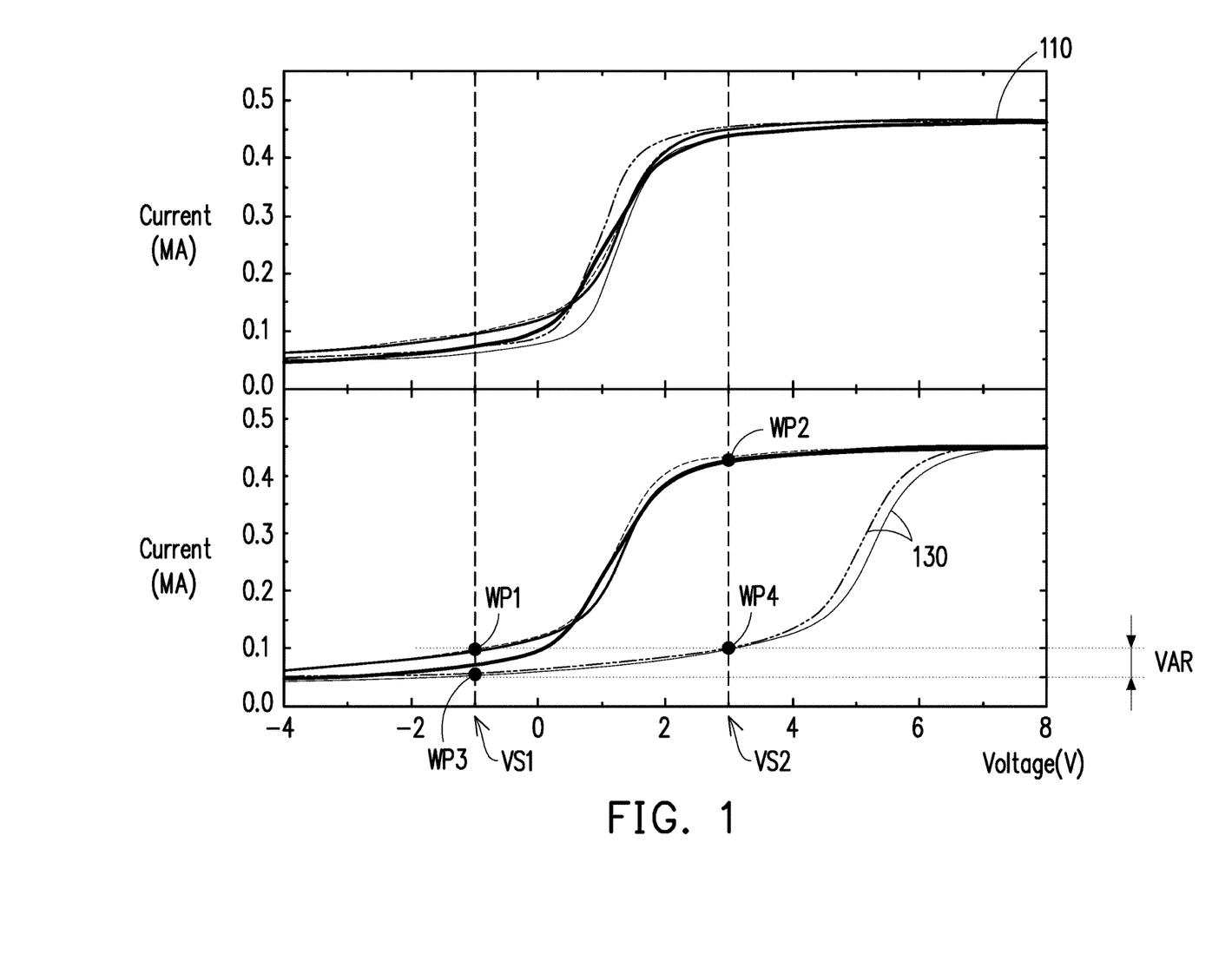
FIG. 1 illustrates characteristic curves of conventional memory cells.

According to the related art, a mechanism of reading a non-volatile memory with a voltage-accumulation vector-matrix multiplication structure has been proposed. Please refer to FIG. 1, which illustrates characteristic curves of conventional memory cells. As shown in FIG. 1, curves 110 and 120 are characteristic curves of memory cells programmed to be in a state of low threshold voltage, and a curve 130 is a characteristic curve of memory cells programmed to be in a state of high threshold voltage. The curves 120 and 130 are characteristic curves configured to respectively represent some memory cells (programmed to be in a state of low threshold voltage) and the other memory cells (programmed to be in a state of high threshold voltage) in one memory cell string. Besides, according to the related art, operating voltages VS1 and VS2 are set according to the curves 120 and 130, and input voltages are applied to the memory cells according to the operating voltages VS1 and VS2, so as to perform a reading operation on the memory cells.

According to the related art, the curves 110-130 respectively have work points WP1-WP4 corresponding to the operating voltages VS1 and VS2; three of the work points WP1, WP3, and WP4 correspond to the state of high resistance of the memory cells, and one of the work point WP2 corresponds to the state of low resistance of the memory cells.

In the related art, note that the accumulated voltages of the memory cell strings are mainly determined according to the memory cells in the state of high resistance. It can be learned from the curve 130 that when the resistance provided by the memory cells corresponding to the curve 130 is changed due to process drift or any other reason (e.g., a drift VAR), linearity of the accumulated voltages is reduced, and the accuracy of the reading operation is negatively affected.

SUMMARY

The disclosure provides a non-volatile memory and a reading method thereof for improving linearity of accumulated voltages.

The reading method includes: erasing a plurality of memory cells in a memory cell string; setting a target memory cell of the memory cells, setting an initial voltage, generating a plurality of programming voltages by gradually increasing the initial voltage based on a step value, sequentially performing a plurality of programming operations by the target memory cell according to the programming voltages, and verifying the target memory cell to obtain a first verifying current during the programming operations; setting a corresponding programming voltage as a target voltage through determining the first verifying current and a first reference current; and performing the programming operations on the memory cells other than the target memory cell according to the target voltage to set the memory cell string as a reading reference memory cell string.

In an embodiment of the disclosure, a non-volatile memory device includes a memory cell array and a controller. The memory cell array includes a plurality of memory cell strings, and each of the memory cell strings includes a plurality of memory cells. The controller is coupled to the memory cell array. The controller is configured to erase a plurality of memory cells in a selected memory cell string of the memory cell strings; set a target memory cell of the memory cells of the selected memory string, set an initial voltage, generate a plurality of programming voltages by gradually increasing the initial voltage based on a step value, sequentially perform a plurality of programming operations by the target memory cell according to the programming voltages, verify the target memory cell to obtain a first verifying current during the programming operations; set a corresponding programming voltage as a target voltage through determining the first verifying current and a first reference current; perform the programming operations on the memory cells other than the target memory cell according to the target voltage to set the memory cell string as a reading reference memory cell string.

In view of the above, the programming operation is performed on the selected target memory cell according to one or more embodiments of the disclosure; during the programming operation, the working voltage (work point) of the memory cell string is found according to the verifying current of the target voltage. As such, in the characteristic curve of the memory cell strings provided herein, the number of work points corresponding to the state of high resistance can be reduced, so as to increase the linearity of the accumulated voltage on the condition of programming different memory cells in the memory cell strings.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 2:
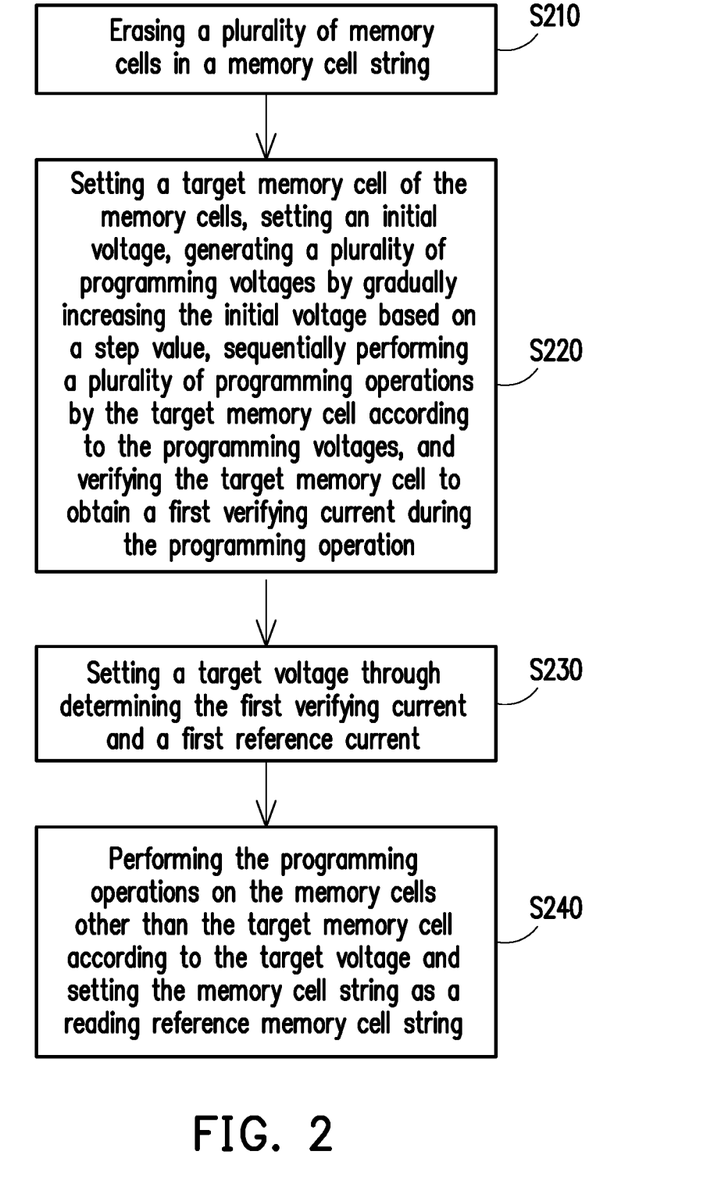
FIG. 2 is a flow chart of a reading method of a non-volatile memory according to an embodiment of the disclosure.

Please refer to FIG. 2, which is a flow chart of a reading method of a non-volatile memory according to an embodiment of the disclosure. The present embodiment is applicable to a non-volatile memory with a voltage-accumulation vector-matrix multiplication structure. In step S210, a plurality of memory cells of a memory cell string is erased. In step S220, one or more of the memory cells in the memory cell string is set as a target memory cell. In step S220, an initial voltage is also set, a plurality of programming voltages are sequentially generated by increasing the initial voltage according to a step value, and a plurality of programming operation are sequentially performed by the target memory cell according to the programming voltages. The programming operations can be performed through incremental-step-pulse programming (ISPP).

In step S220, the target memory cell may perform the programming operations according to the gradually increasing programming voltages, so as to adjust its threshold voltage. According to the present embodiment, as the programming voltages gradually raise, the threshold voltage of the target memory cell can gradually increase.

Besides, in step S220, along with the programming operations, the target memory cell is verified to generate a plurality of verifying currents, respectively. As to the details of the verifying operations, when the target memory cell is verified, an input voltage may be applied to an input terminal of the target memory cell, a verifying voltage may be applied to a bit line connected to the target memory cell, and a current flowing through the target memory cell can be measured to obtain the verifying current.

In step S230, a target voltage is set through determining a first verifying current and a first reference current. Here, the first reference current is a predetermined current. In step S230, the first verifying current and the first reference current are compared, and the target voltage is set according to the comparison result. Together with the programming operations, the threshold voltage of the target memory cell gradually increases. As such, during the verifying operations performed together with the programming operations, the obtained first verifying current is gradually reduced. In step S230, when the first verifying current is less than the first reference current, the programming voltage at this time can be set as the target voltage.

From another perspective, when the target voltage is completely set, a first operating voltage can be set according to the input voltage of the memory cells in step S230.

In step S240, the programming operations are performed on memory cells other than the target memory cell in the memory cell string according to the target voltage set in the previous steps, and the memory cell string is set as a reading reference memory cell string.

Figure 3A:
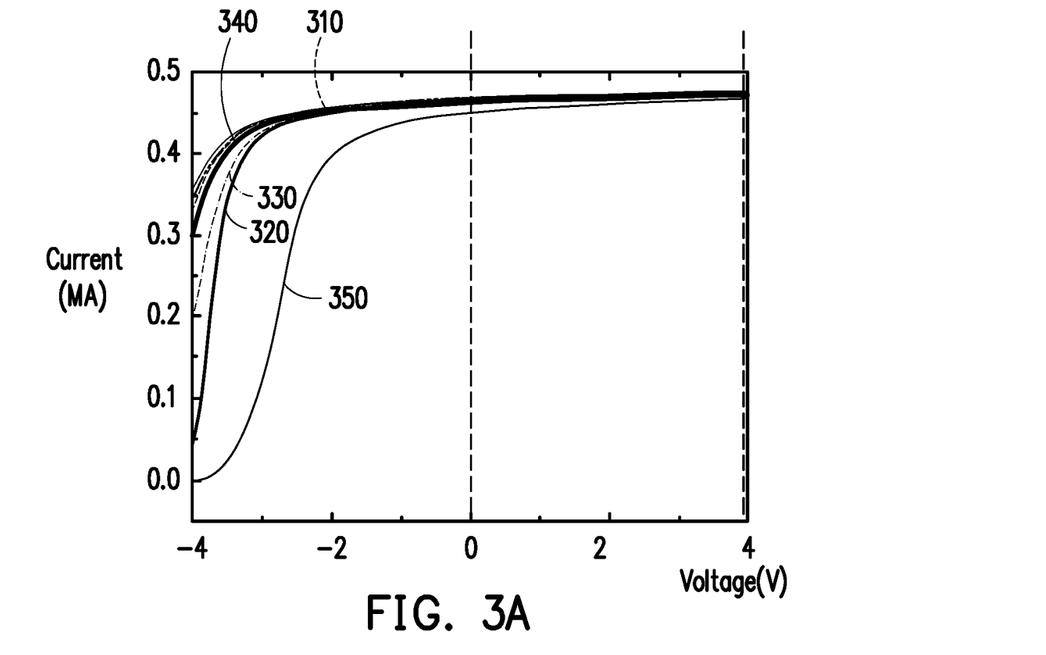
FIG. 3A to FIG. 3C illustrate wavelengths showing operations performed in a reading method of a non-volatile memory according to an embodiment of the disclosure.
Figure 3B:
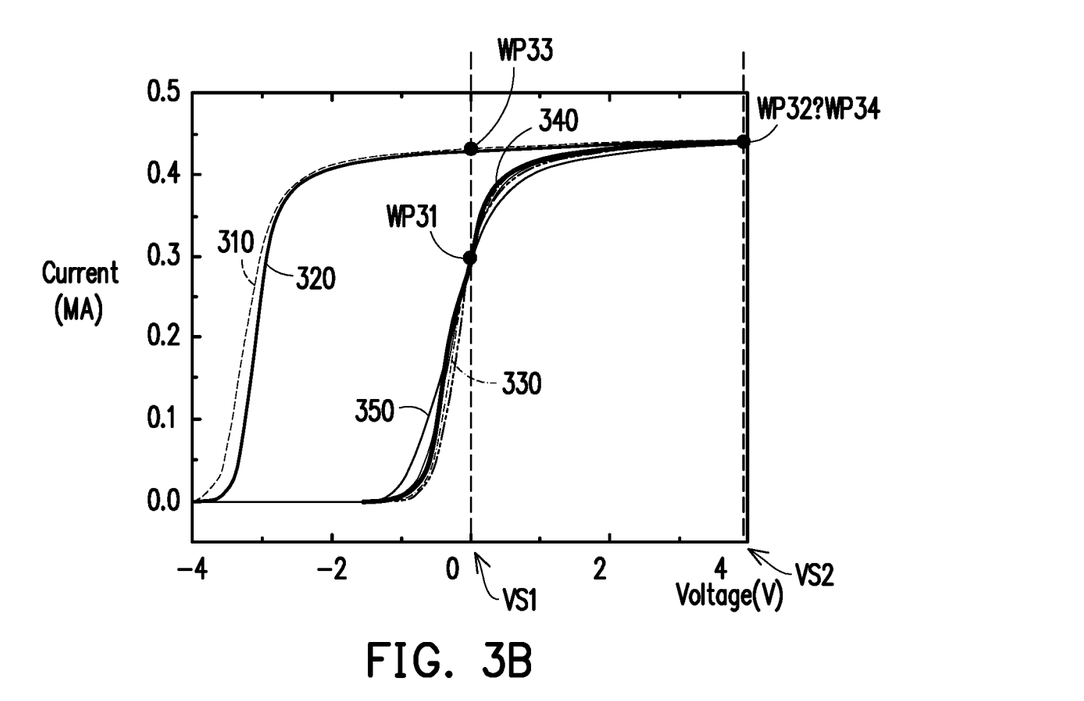
Figure 3C:
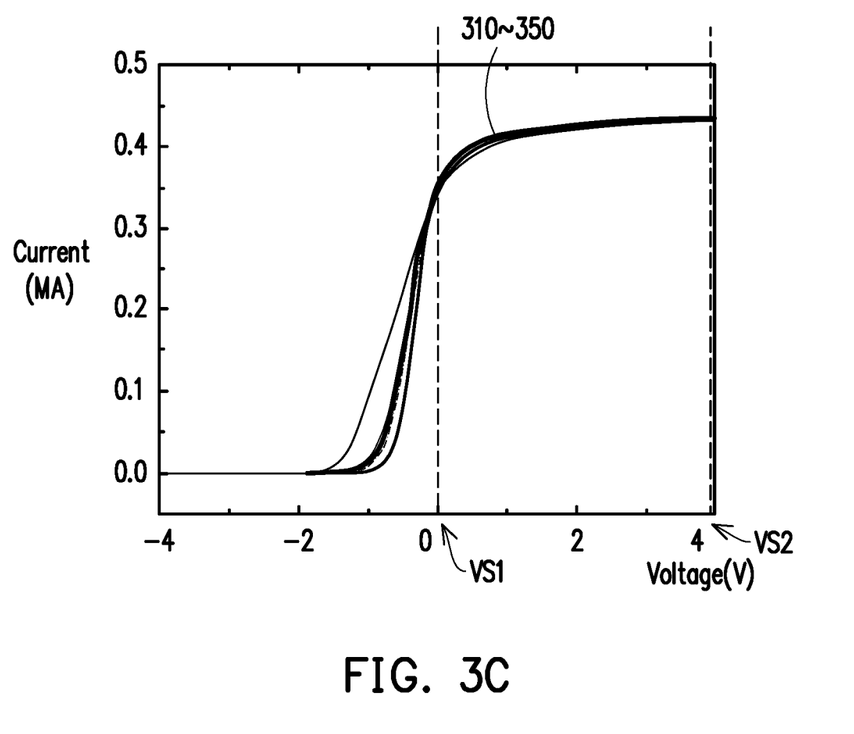

As to the operation details of said steps, please refer to FIG. 3A to FIG. 3C, which illustrate wavelengths showing operations performed in a reading method of a non-volatile memory according to an embodiment of the disclosure. For instance, the memory cell string has five memory cells, and the characteristic curves indicating the relations between the current and the input voltage of the memory cells are curves 310-350. In FIG. 3A, all five memory cells are erased corresponding to the step S210, and the five memory cells all have relatively low threshold voltages. Besides, in FIG. 3B, three of the five memory cells are set as the target memory cells corresponding to the step S220, and the programming operations are performed through ISPP. Here, curves 330-350 are respective characteristic curves of the three target memory cells.

As shown in FIG. 3B, when the verifying current obtained by performing the verifying operations on the three target memory cells is less than the reference current, the programming operations can be terminated. The programming voltage at this time can be set as the target voltage. Here, the target voltage can be equal to the programming voltage at this time or the current programming voltage plus or minus a deviation value.

On the other hand, in an embodiment of the disclosure, when the target voltage is set, a first operating voltage VS1 can be set according to the input voltage received by the target memory cell, wherein the curves 330-350 correspond to the first operating voltage VS1 through the work point WP31, and the curves 310-320 correspond to the first operating voltage VS1 through the work point WP33.

Besides, according to an embodiment of the disclosure, a second operating voltage VS2 can be further set. On the condition that the second operating voltage VS2 serves as the input voltage, the verifying currents generated by the target memory cell and by the memory cells other than the target memory cell can all be greater than a predetermined second reference current. Here, the second reference current is greater than the first reference current, and the second operating voltage VS2 is greater than the first reference voltage VS1. Besides, the curves 330-350 correspond to the second operating voltage VS2 through the work point WP32, and the curves 310-320 correspond to the second operating voltage VS2 through the work point WP34. In the present embodiment, the work points WP32 and WP34 are almost overlapped.

It can be clearly seen from FIG. 3B that only one work point WP31 corresponds to the state of high resistance of the memory cell according to an embodiment of the disclosure, and three work points correspond to the state of low resistance of the memory cells. Since the accumulated voltages of the memory cell string are mainly determined by the memory cells programmed to be in the state of high resistance, the impact of the accumulated voltages caused by the resistance drift while the memory cells are in the state of high resistance can be effectively alleviated according to an embodiment of the disclosure, so as to improve the linearity of the accumulated voltages of the memory cell string.

In FIG. 3C, corresponding to step S240, the programming operations are performed on all of the memory cells other than the target memory cell in the memory cell string according to the target voltage, and the curves 310-350 of all of the memory cells are concentrated. After step S240 is completed, the memory cell string can serve as the reading reference memory cell string while a reading operation is performed on any of the memory cell strings in the non-volatile memory.

By the way, according to an embodiment of the disclosure, each memory cell in the memory cell string can be programmed to be in two different states, i.e., a state of first threshold voltage and a state of second threshold voltage (the first threshold voltage is less than the second threshold voltage). While the reading operation is performed on any of the memory cell strings, the input voltage provided to each memory cell can be set according to the first operating voltage VS1 and the second operating voltage VS2. That is, the input voltage received by each memory cell can be the first operating voltage VS1 or the second operating voltage VS2.

Figure 4A:
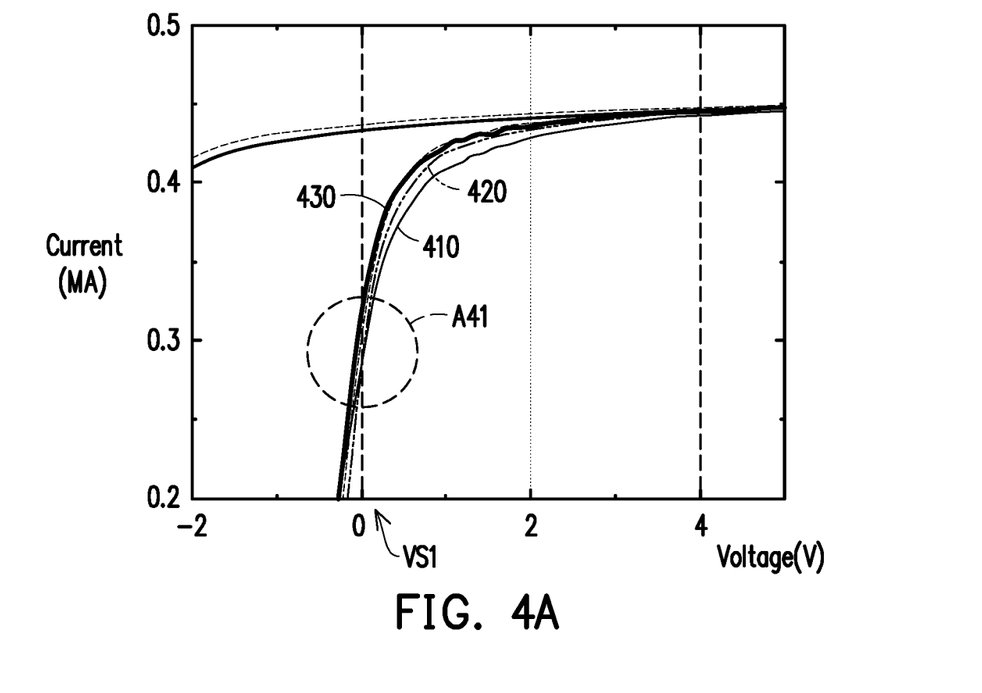
FIG. 4A schematically illustrates characteristic curves of a plurality of memory cells according to an embodiment of the disclosure.

Please specifically refer to FIG. 4A, which schematically illustrates characteristic curves of a plurality of memory cells according to an embodiment of the disclosure. For instance, the memory cell string has a plurality of memory cells, and the programming operations are completed. Here, the three memory cells in the memory cell string are programmed to be in the state of high resistance. In the characteristic curves 410-430 respectively corresponding to the three memory cells, the amount of the current corresponding to the first operating voltage VS1 almost stays the same. Additionally, the accumulated voltages of the memory cell string are guided by the three memory cells having the relatively high resistance and are specifically applicable to calculations associated with neural network.

Figure 4B:
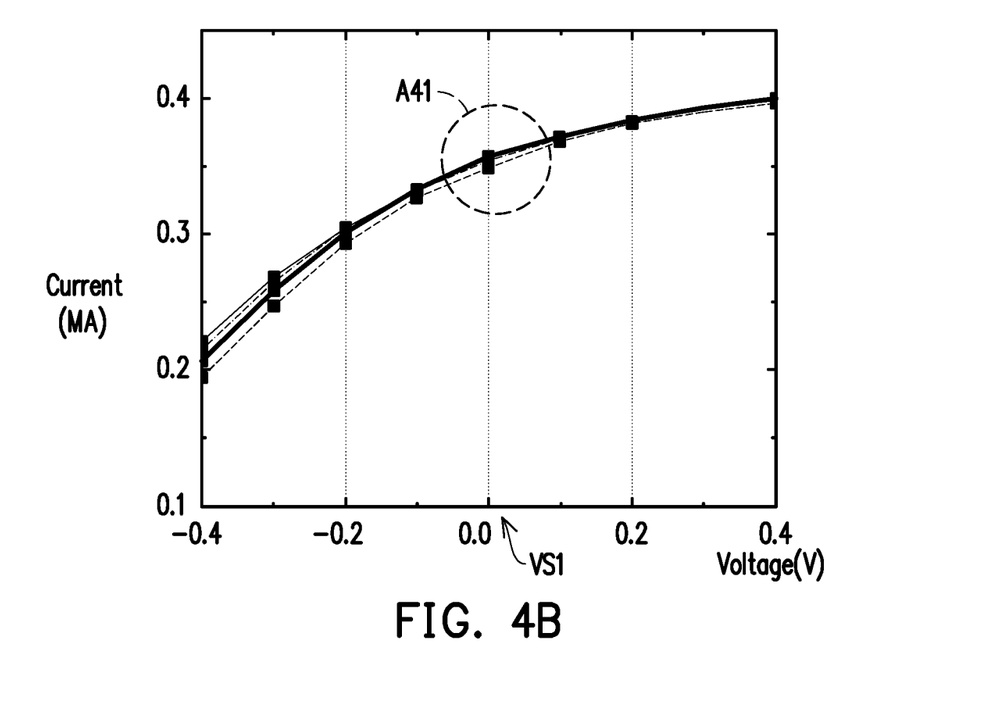
FIG. 4B is a schematic top enlarged view of the curves depicted in FIG. 4A according to the embodiment of the disclosure.

Please refer to FIG. 4B, which is a schematic top enlarged view of the curves depicted in FIG. 4A according to the embodiment of the disclosure. Here, the region A41 depicted in FIG. 4A is enlarged; thereby, it can be learned that each memory cell has uniform resistance on the condition corresponding to the first operating voltage VS1, which renders relatively small variations in currents. As such, the accumulated voltages of the memory cell string can be stably generated.

Figure 5:
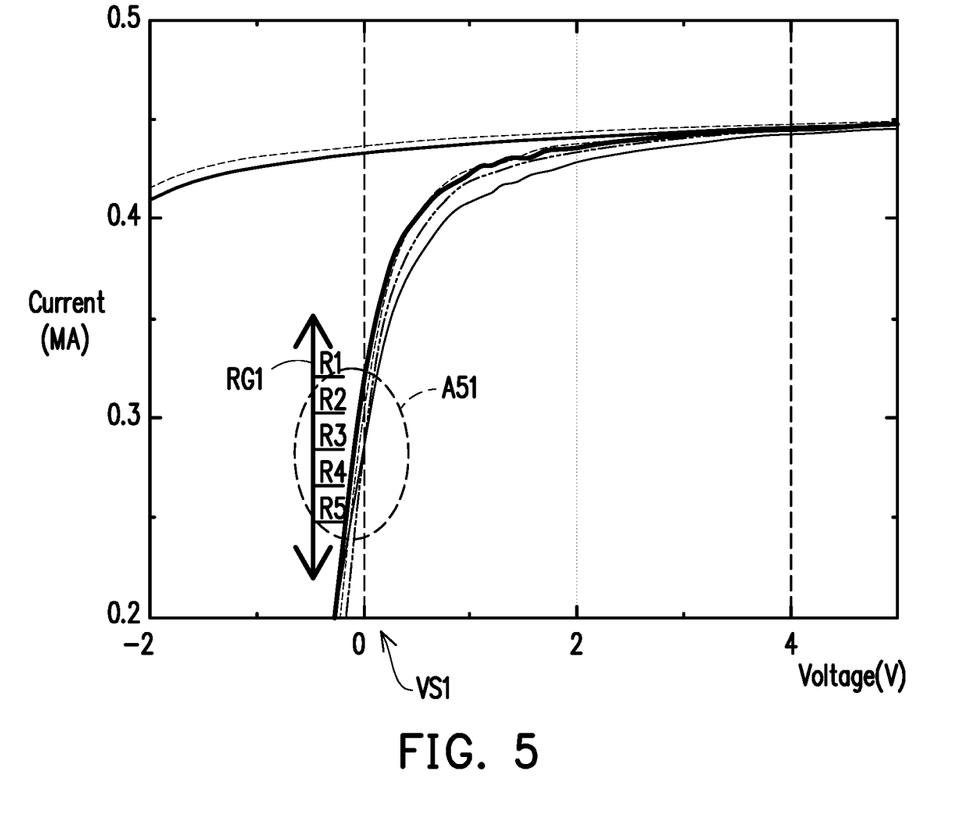
FIG. 5 illustrates characteristic curves of memory cells according to another embodiment of the disclosure.

Please refer to FIG. 5, which illustrates characteristic curves of memory cells according to another embodiment of the disclosure. As shown in FIG. 5, some memory cells in the memory cell string are programmed to be in the state of high resistance, while the other memory cells stay erased. According to the characteristic curves in FIG. 5, the memory cells programmed to be in the state of high resistance can have a number of different resistances corresponding to the first operating voltage VS1. That is, in an embodiment of the disclosure, on the condition that the first operating voltage VS1 acts as the input voltage, the resistances of the memory cells programmed to be in the state of high resistance can be distributed within a range RG1. In view of said characteristics, when the reading operation is performed on the memory cell string, through providing the first operating voltage VS1 as the input voltage, the memory cells programmed to be in the state of high resistance can respectively provide different reading resistances, whereby multi-level reading data can be generated.

For instance, when the reading operation is performed, five memory cells programmed to be in the state of high resistance respectively provide different reading resistances R1-R5, and a ratio of the reading resistances R1-R5 is 1:2:4:8:16. As such, $2^5=32$-levels reading data can be provided.

Figure 6:
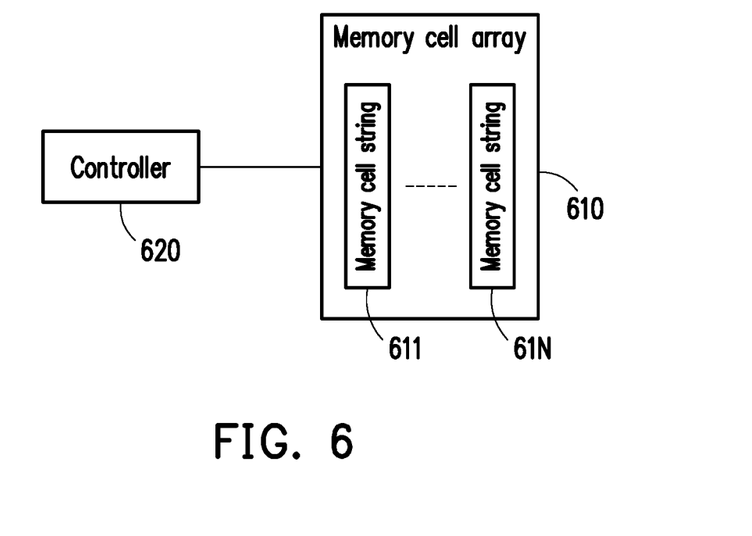
FIG. 6 is a schematic view of a non-volatile memory according to another embodiment of the disclosure.

Please refer to FIG. 6, which is a schematic view of a non-volatile memory according to another embodiment of the disclosure. The non-volatile memory 600 includes a memory cell array 610 and a controller 620. The memory cell array 610 includes a plurality of memory cell strings 611-61N. The controller 620 is coupled to the memory cell array 610. Here, when a data reading operation is performed on the memory cell strings 611-61N, the controller 620 can perform the steps shown in FIG. 2 on one of the memory cell strings 611-61N and thereby set the first operating voltage, set the second operating voltage, and/or generate the reading reference memory cell string. As such, the controller 620 can perform the reading operation on one or more stored data in the memory cell strings 611-61N according to the first operating voltage, the second operating voltage, and/or by generating the reading reference memory cell string.

Figure 7:
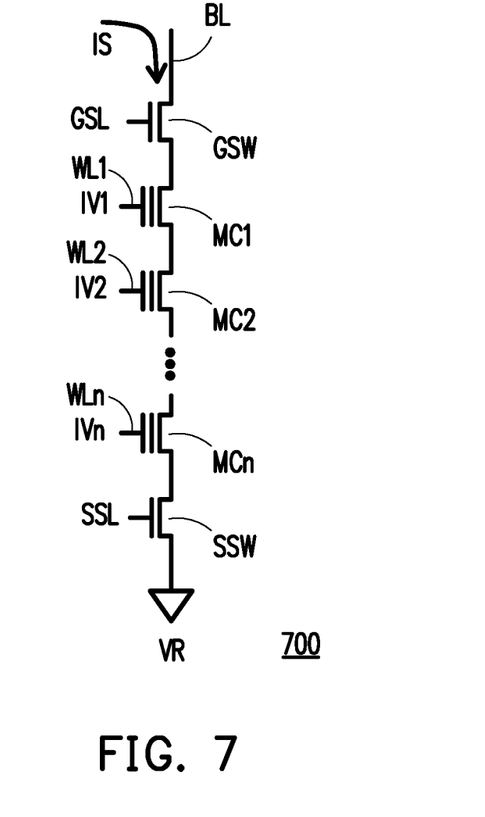
FIG. 7 schematically illustrates a way to implement a memory cell string according to an embodiment of the disclosure.

Please refer to FIG. 7, which schematically illustrates a way to implement a memory cell string according to an embodiment of the disclosure. The memory cell string 700 includes selection switches GSW and SSW and a plurality of memory cells MC1-MCn. The memory cells MC1-MCn are serially connected and coupled to one another. The selection switch GSW is coupled between the bit line BL and the memory cell MC1, and the selection switch SSW is coupled between the memory cell MCn and the reference voltage VR. Control terminals of the selection switches GSW and SSW respectively receive control signals GSL and SSL. The memory cells MC1-MCn receive input voltages IV1-IVn through bit lines WL1-WLn, respectively. Here, each of the input voltages IV1-IVn can be one of the first operating voltage and the second operating voltage. When the memory cell string 700 is read, the selection switches GSW and SSW are turned on, and a current IS flowing through the memory cell string 700 can be applied to calculate the accumulated voltages provided by the memory cell string 700. For instance, if the resistances R1-Rn are respectively provided by the memory cells MC1-MCn, the accumulated voltage is equal to R1×IS+R2×IS+ . . . +Rn×IS. Here, in the present embodiment, each of the memory cells MC1-MCn can be programmed to be in the state of high resistance or stay erased (in the state of low resistance). Since the resistances provided by the memory cells programmed to be in the state of high resistance are far greater than the resistances provided by the memory cells programmed to be in the state of low resistance, the accumulated voltages are guided by the resistances provided by the memory cells programmed to be in the state of high resistance, and the resistances provided by the memory cells programmed to be in the state of low resistance can be ignored.

To sum up, in one or more embodiments of the disclosure, the programming operations are performed on some target memory cells in the memory cell strings, and the target voltage is set through verifying the verifying currents of the target memory cells. According to the target voltages, the programming operations are performed on the memory cells other than the target memory cells in the memory cell strings, and thereby the memory cell string can be set as the reading reference memory cell string. Through said settings, the linearity of the accumulated voltages provided by the memory cell strings can be effectively maintained, given that there may be different combinations of the threshold voltages of the memory cells.

It will be apparent to those skilled in the art that various modifications and variations can be made to the structure provided herein without departing from the scope or spirit of the invention. In view of the foregoing, it is intended that the disclosure cover modifications and variations of this invention provided they fall within the scope of the following claims and their equivalents.

What is claimed is:

1. A reading method of a non-volatile memory, comprising:
    erasing a plurality of memory cells of a memory cell string;
    setting a target memory cell of the plurality of memory cells, setting an initial voltage, generating a plurality of programming voltages by gradually increasing the initial voltage based on a step value, sequentially performing a plurality of programming operations by the target memory cell according to the plurality of programming voltages, and verifying the target memory cell to obtain a first verifying current during the plurality of programming operations;

setting a corresponding programming voltage of the plurality of programming voltages as a target voltage through determining the first verifying current and a first reference current; and performing the plurality of programming operations on the plurality of memory cells other than the target memory cell according to the target voltage and setting the memory cell string as a reading reference memory cell string.

2. The reading method according to claim 1, further comprising:
setting an input voltage of the target voltage as a first operating voltage.

3. The reading method according to claim 2, further comprising:
setting a second operating voltage, so that a second verifying current generated by the target memory cell under the second operating voltage is greater than a second reference current,
wherein the first reference current is less than the second reference current.

4. The reading method according to claim 1, wherein the step of setting the target voltage through determining the first verifying current and the first reference current comprises:
comparing the first verifying current and the first reference current, and setting the target voltage according to the corresponding programming voltage when the increasing first verifying current is greater than the first reference current.

5. The reading method according to claim 1, wherein at least one first memory cell of the plurality of memory cells is programmed to be in a first resistance state, a plurality of second memory cells of the plurality of memory cells are programmed to be in a second resistance state, and the plurality of the second memory cells provide a plurality of reading resistances according to the input voltage and generate multi-level reading data,
wherein a resistance of the at least one first memory cell is lower than resistances of the plurality of second memory cells.

6. The reading method according to claim 5, wherein the plurality of reading resistances are different.

7. The reading method according to claim 1, wherein the step of verifying the target memory cell to obtain the first verifying current during the plurality of programming operations comprises
during the plurality of programming operations, providing a verifying voltage to the target memory cell and sensing a current on the target memory cell to obtain the first verifying current.

8. A non-volatile memory comprising:
a memory cell array comprising a plurality of memory cell strings, each of the plurality of memory cell strings comprising a plurality of memory cells; and
a controller coupled to the memory cell array and configured to:
erase the plurality of memory cells of a selected memory cell string of the plurality of memory cell strings;
set a target memory cell of the plurality of memory cells of the selected memory cell string, set an initial voltage, generate a plurality of programming voltages by gradually increasing the initial voltage based on a step value, sequentially perform a plurality of programming operations by the target memory cell according to the plurality of programming voltages, and verify the target memory cell to obtain a first verifying current during the plurality of programming operations;
set a target voltage through determining the first verifying current and a first reference current; and
perform the plurality of programming operations on the plurality of memory cells other than the target memory cell according to the target voltage and set the memory cell string as a reading reference memory cell string.

9. The non-volatile memory according to claim 8, wherein the controller is further configured to:
set an input voltage of the target voltage as a first operating voltage.

10. The non-volatile memory according to claim 9, wherein the controller is further configured to:
set a second operating voltage, so that a second verifying current generated by the target memory cell under the second operating voltage is greater than a second reference current,
wherein the first reference current is less than the second reference current.

11. The non-volatile memory according to claim 8, wherein the controller is further configured to:
compare the first verifying current and the first reference current, and set the target voltage according to the programming voltage corresponding to the target memory cell when the increasing first verifying current is greater than the first reference current.

12. The non-volatile memory according to claim 8, wherein at least one first memory cell of the plurality of memory cells is programmed to be in a first resistance state, a plurality of second memory cells of the plurality of memory cells are programmed to be in a second resistance state, and the plurality of the second memory cells provide a plurality of reading resistances according to the input voltage and generate multi-level reading data,
wherein a resistance of the at least one first memory cell is lower than resistances of the plurality of second memory cells.

13. The non-volatile memory according to claim 8, wherein the plurality of reading resistances are different.

14. The non-volatile memory according to claim 8, wherein the controller is further configured to provide a verifying voltage to the target memory cell during the plurality of programming operations and sensing a current on the target memory cell to obtain the first verifying current.

15. The non-volatile memory according to claim 8, wherein each of the plurality of memory cell strings further comprises:
a first selection switch coupled between a bit line and the plurality of memory cells and controlled by a first selection control signal; and
a second selection switch coupled between plurality of memory cells and a reference voltage and controlled by a second selection control signal,
wherein, the plurality of memory cells are serially connected and coupled to one another.

16. The non-volatile memory according to claim 8, wherein the plurality of memory cells of each of the plurality of memory cell strings are respectively coupled to a plurality of word lines, so as to respectively receive a plurality of input voltages.

* * * * *